(12) United States Patent
Quenzer et al.

(10) Patent No.: US 9,835,943 B2
(45) Date of Patent: Dec. 5, 2017

(54) PROCESS FOR THE LASER TREATMENT OF COATINGS

(71) Applicant: Merck Patent GmbH, Darmstadt (DE)

(72) Inventors: Matthias Quenzer, Lautertal (DE); Sylke Klein, Rossdorf (DE)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 14/718,194

(22) Filed: May 21, 2015

(65) Prior Publication Data

US 2015/0336215 A1 Nov. 26, 2015

(30) Foreign Application Priority Data

May 23, 2014 (EP) .................................... 14001813

(51) Int. Cl.
| | | |
|---|---|---|
| *G03F 7/004* | (2006.01) | |
| *G21K 5/02* | (2006.01) | |
| *B42D 25/30* | (2014.01) | |
| *B44F 1/08* | (2006.01) | |
| *B41M 5/26* | (2006.01) | |
| *G03F 7/20* | (2006.01) | |
| *G03F 7/00* | (2006.01) | |
| *B41M 5/24* | (2006.01) | |
| *B41M 5/28* | (2006.01) | |

(52) U.S. Cl.
CPC ............. *G03F 7/0042* (2013.01); *B41M 5/24* (2013.01); *B41M 5/267* (2013.01); *B41M 5/28* (2013.01); *B42D 25/30* (2014.10); *B44F 1/08* (2013.01); *G03F 7/004* (2013.01); *G03F 7/0037* (2013.01); *G03F 7/2053* (2013.01); *G21K 5/02* (2013.01); *Y10T 428/24876* (2015.01); *Y10T 428/24901* (2015.01)

(58) Field of Classification Search
CPC ...... G03F 7/004; G03F 7/0037; G03F 7/0042; G03F 7/2053; B41M 5/24; B41M 5/267; B41M 5/465; B41M 5/28
USPC ................ 430/270.1, 2, 541, 363, 496, 503; 427/555; 428/195.1, 204, 207; 524/413, 524/502; 347/225, 232

See application file for complete search history.

(56) References Cited

U.S. PATENT DOCUMENTS

| | | |
|---|---|---|
| 4,675,212 A | 6/1987 | Wiley et al. |
| 5,223,322 A | 6/1993 | Colyer et al. |
| 5,223,360 A | 6/1993 | Prengel et al. |
| 7,047,883 B2 | 5/2006 | Raksha et al. |

(Continued)

FOREIGN PATENT DOCUMENTS

| | | |
|---|---|---|
| EP | 0428933 A2 | 5/1991 |
| EP | 1215233 A1 | 6/2002 |

(Continued)

OTHER PUBLICATIONS

Thadeus Schauer et al. "Beschriften Ohne Opfer" Lasertechnik, Kunststoffe 9 (2008) S. pp. 102-107.

(Continued)

*Primary Examiner* — Amanda C Walke
(74) *Attorney, Agent, or Firm* — Millen White Zelano & Branigan, PC

(57) ABSTRACT

The present invention relates to a process for the laser treatment of effect pigment-containing coatings, to coatings produced using this process, and to the use thereof in decorative and security products.

36 Claims, 4 Drawing Sheets

(56) References Cited

U.S. PATENT DOCUMENTS

| | | |
|---|---|---|
| 7,217,745 B2 | 5/2007 | Edler |
| 8,993,103 B2 | 3/2015 | Clauter et al. |
| 2002/0107305 A1 | 8/2002 | Edler |
| 2004/0013969 A1 | 1/2004 | Delp et al. |
| 2004/0051297 A1 | 3/2004 | Raksha et al. |
| 2006/0141391 A1* | 6/2006 | Klein ..................... B41M 3/14 430/270.1 |
| 2010/0021658 A1 | 1/2010 | Raksha et al. |
| 2010/0196698 A1* | 8/2010 | Trummer ............ B29C 65/1677 428/328 |
| 2013/0288024 A1 | 10/2013 | Clauter et al. |

FOREIGN PATENT DOCUMENTS

| | | |
|---|---|---|
| EP | 1279517 A2 | 1/2003 |
| EP | 1661729 A2 | 5/2006 |
| GB | 2272848 A | 6/1994 |
| WO | 2004/045857 A2 | 6/2004 |
| WO | 2011107271 A1 | 9/2011 |
| WO | 2012079674 A1 | 6/2012 |

OTHER PUBLICATIONS

European Search Report dated Oct. 10, 2015, issued in corresponding EP Application No. 15001405.8, 8 pages.

* cited by examiner

PROCESS FOR THE LASER TREATMENT OF COATINGS

The present invention relates to a process for the laser treatment of coatings which comprise effect pigments, to coatings produced using this process, and to the use thereof in decorative and security products.

The use of laser radiation for the treatment of plastics has been known for some time and is used in various areas, for example for marking or for welding. Laser marking here is taken to mean the marking or inscription of plastics and paint surfaces with the aid of an intensive laser beam.

The literature discloses processes for the laser inscription of layer systems which are based on phenomena such as foaming or carbonization of the polymer matrix of the layer system, carbonization/darkening of the laser additive (EP 1 215 233 B), bleaching of effect pigments (WO 2011/107271) and the color change of laser-sensitive thermo- or photochromic additives.

In addition, laser markings can be produced in a coating layer system by ablation of the upper coating layer. The ablation can be effected by laser light-absorbent or -reflective additives which are present in the coating layer itself or in a sacrificial layer applied beneath the coating layer (T. Schauer, R. Maurer, H. Greisiger, Kunstoffe 9 (2008), pp. 102-107).

Three-dimensional images and motifs can be produced in effect pigment-containing layers by changes in the spatial alignment of the effect pigments in the layer, such as, for example, by embossing (U.S. Pat. No. 4,675,212 and GB 2 272 848 A), magnetic alignment (U.S. Pat. No. 7,047,883 and EP 428 933 B1) or by the so-called kiss-printing process (WO 2012/079674).

However, there continues to be a need for processes for influencing coating properties, in particular for the application of readily visible and high-contrast patterns in pigment-containing coatings.

Surprisingly, a novel process has now been found by means of which the optical properties of effect pigment-containing coatings can be influenced and which is particularly suitable for the application of patterns or markings, for example as security feature.

The invention relates to a process for modifying the optical properties of an effect pigment-containing coating comprising the irradiation of a coating (A) comprising at least one effect pigment and at least one IR radiation-absorbent component using an IR laser (infrared laser), where the IR radiation-absorbent component is partly or completely removed from the irradiated areas of the coating (A) and the effect pigment is partly or completely uncovered by the action of the laser radiation.

Uncovered in the sense of the present invention means that the effect pigment is not covered or is only partly covered by the IR radiation-absorbent component.

The invention furthermore relates to coatings comprising optical patterns, preferably obtainable by means of the novel process, to products comprising such coatings and to the use thereof in decorative and security products.

The process according to the invention enables the optical properties of a coating to be modified. The process can be applied over a large area in order to modify the gloss or sparkle of a coating or imagewise in order to produce optical patterns.

By means of the novel process, a product can preferably be provided which has on a surface, which may consist of multifarious materials, a coating which itself has a pattern, such as, for example, images, markings, inscriptions, etc. In particular, high-contrast, preferably three-dimensional patterns can be produced using the invention.

In addition, the process enables the production of permanent and abrasion-resistant patterns. Surprisingly, it has been found that the binder of the coating is preferably not carbonized by means of the novel process.

An advantage of the invention is that the optical properties of a coating can be modified without the effect pigments themselves being modified. In addition, the spatial alignment of effect pigments and/or the roughness of the coated surface are preferably not or at least not significantly modified here.

The invention advantageously enables the production of a readily visible and high-contrast, but non-tactile pattern, preferably with a three-dimensional appearance. In particular, this enables a very finely graduated change in contrast and effect within the lasered layer areas without damaging the effect pigments. These finely graduated contrasts and halftones even facilitate images in photo quality given corresponding laser settings.

It is a particular advantage of the present invention that a possibility for the production of preferably three-dimensional patterns in coatings is provided by means of the process according to the invention, which can be employed without major additional technical and equipment complexity for the production of optionally three-dimensional patterns in coatings which comprise effect pigments.

In particular, the preferably computer-supported laser process enables any desired patterns to be produced in a freely selectable sequence and frequency or even individualized labelling per individual product without long set-up times. However, the laser process according to the invention can also be applied over a large area. Rapid and reproducible production of decorative mass articles or security documents is therefore possible in a simple and inexpensive manner by means of the process according to the invention. Markings in thin layers, such as coatings, paints and prints, are also possible without significantly damaging the layers.

The process according to the invention for modifying the optical properties of a pigment-containing coating preferably comprises the steps of:

a) application of a coating (A) comprising at least one effect pigment and at least one IR radiation-absorbent component to a substrate and b) irradiation of the coating (A) applied in step a) using an IR laser, where the IR radiation-absorbent component is partly or completely bleached, oxidized and/or displaced by the action of laser light, c) optionally application of a protective layer (B) to the coating (A) treated in step b).

In this process, a conventional substrate, as described in greater detail below, is firstly provided with a coating comprising the effect pigment and the IR radiation-absorbent component, and this coating is optionally correspondingly flashed off and/or dried and optionally cured, baked or crosslinked. If desired, the coating (A) and the protective layer (B) can be solidified simultaneously.

The optionally three-dimensional pattern is then lasered into the coating, which, in accordance with the laser parameters selected, results in partial or complete bleaching, oxidation and/or displacement of the IR radiation-absorbent component in the coating. This partly or completely uncovers the effect pigment, i.e. it is not or only partly covered by the IR radiation-absorbent component.

In the lasered areas, the environment around the effect pigments which has been correspondingly optically modified in contrast, such as, for example, gradually paler backgrounds, and/or the reflection of effect pigments which are not aligned with the layer surface in a plane-parallel manner enable the patterns produced to have a three-dimensional appearance, which is enhanced further when viewed from various observation angles. The surface roughness of the coating itself is not modified here.

The energy of the laser beam and the properties of the effect pigment-containing coating are matched here in such a way that the IR radiation-absorbent component is partly or completely removed, preferably displaced, oxidized and/or bleached. The effect pigment is thereby uncovered without the effect pigment itself or its spatial alignment in the coating being modified.

IR lasers having a wavelength of 0.6-50 μm can be used. Preference is given to the use of IR lasers in the near infrared region (0.65-10.6 μm), for example having the wavelength 1064 nm. The lasers are preferably operated in pulsed mode, in particular with pulse frequencies of 40-100 kHz. The laser power is preferably >20%, in particular 30-50%. The speed can be 200-6000 mm/s. The usual commercially available equipment can be employed, preferably Nd:YAG lasers and YVO$_4$ lasers.

An essential component of the invention is a coating (A) which comprises at least one effect pigment and at least one IR radiation-absorbent component. This component is partly or completely removed during lasering. The IR radiation-absorbent component is preferably partly or completely displaced from the irradiated areas of the coating (A) by the action of the laser radiation, and the effect pigment is partly or completely uncovered. It is also possible for the IR radiation-absorbent component to be partly or completely bleached and/or oxidized by the action of the laser radiation. This can occur in addition to or instead of the displacement of the IR radiation-absorbent component.

An optionally three-dimensional pattern is produced in the coating here by the partial or complete removal of the IR-absorbent component, preferably by displacement, optionally additionally or also exclusively by bleaching and/or oxidation, and rendered visible via the optical effects of the effect pigments. The image of the optionally three-dimensional pattern is very clearly pronounced here with high contrast, and photo qualities can be achieved given corresponding settings without the effect pigments experiencing a deflection out of their original position present.

The individual color and/or gloss effects which can be achieved by the effect pigments are not crucial per se for the success of the present invention. Instead, the success according to the invention is achieved by the modification of the optically perceptible effect of the preferably flake-form effect pigments in the areas of the coating which have been lasered and thus modified in their ambient contrast by various brightness gradations.

In addition, the removal of the IR radiation-absorbent component by displacement, bleaching and/or oxidation also enables effect pigments which are not plane-parallel to the layer surface, i.e. do not reflect at the specular angle, but only come into the reflection position at flat observation angles and are thus able to promote a three-dimensional impression, to contribute to reflection.

The optical effects of the effect pigments are thus enhanced in the lasered layer areas, where, depending on the particle size and type of the effect pigments employed, effects such as pearlescence, sparkling (glitter) and/or shimmer are significantly enhanced and/or the effect color is modified, which enhances the three-dimensional impression without the effect pigments themselves or their spatial alignment present in the layer being modified. The action of the laser radiation preferably enables pearlescence, sparkling (glitter) and/or shimmer of the coating (A) to be enhanced.

This is measurable in the increase in the L values or in the increase in the sparkling intensity $S_i$ and the sparkling area $S_a$ in the lasered areas.

In general, the sparkling (glitter) effect is only perceptible under direct insolation and depending on the observation angle. The sparkling effect is therefore measured with illumination of the measurement sample using very bright LEDs and at three different illumination angles (15°, 45° and 75°) using a Byk-mac i instrument. In each case a high-resolution CCD camera takes one picture perpendicular to the measurement sample. The glittering pigments are visible here as bright dots, measured in the respective luminance degrees (=sparkling intensity $S_i$) and in their area (sparkling area $S_a$) and analyzed using image-processing software. The sparkling effect is evaluated by a comparison of the measurement sample with a defined standard. The measurement values are therefore recorded as Δ values (BYK-Gardner digital catalogue 2013 D "Das objektive Auge" [The Objective Eye], No. 1309 225 015 710, page 97).

If the lasered coatings are assessed coloristically, they generally exhibit higher L values than the unlasered areas, since the IR radiation-absorbent component has been displaced, bleached and/or oxidized by the laser action. On use of an effect pigment having a sparkling effect, such as the Xirallic® grades, the sparkling intensity $S_i$ and sparkling area $S_a$ are in addition likewise increased. In particular, a positive difference which increases to a greater extent the flatter the observation angle becomes is evident. This means that, in the lasered area, the effect pigments which are not plane-parallel to the layer surface, but have been uncovered by the laser action, also come to reflection.

The invention can advantageously be applied in the case of coatings which may comprise virtually all known types of effect pigment. Preference is given to the use of pearlescent pigments, interference pigments, metal-effect pigments and/or liquid-crystal pigments.

Preference is given to the use of effect pigments having a flake-form support, which optionally comprises at least one coating of a metal oxide, metal oxide hydrate or mixtures thereof, a metal mixed oxide, metal suboxide or metal oxynitride, metal fluoride or a polymer.

Pearlescent pigments consist of transparent flakes of high refractive index and exhibit a characteristic pearlescence due to multiple reflections in the case of parallel alignment. Pearlescent pigments of this type which additionally also exhibit interference colors are known as interference pigments.

Although classical pearlescent pigments, such as TiO$_2$ flakes, basic lead carbonate, BiOCl pigments or nacreous pigments, are naturally also suitable in principle, the effect pigments employed for the purposes of the invention are preferably flake-form interference pigments or metal-effect pigments, which have at least one coating of a metal oxide, metal oxide hydrate or mixtures thereof, a metal mixed oxide, metal suboxide, metal oxynitride, metal fluoride or a polymer on a flake-form support.

The flake-form support preferably consists of natural or synthetic mica, kaolin or another phyllosilicate, glass, calcium aluminum borosilicate, SiO$_2$, TiO$_2$, Al$_2$O$_3$, Fe$_2$O$_3$, or polymer flakes. Particular preference is given to flake-form supports consisting of mica, glass, calcium aluminum borosilicate, graphite, SiO$_2$, or Al$_2$O$_3$.

The size of the flake-form support is not crucial per se. The supports generally have a thickness of between 0.01 and 5 µm, in particular between 0.05 and 4.5 µm and particularly preferably from 0.1 to 1 µm. The length or width dimension is usually from 1 to 500 µm, preferably from 1 to 200 µm and in particular from 5 to 125 µm. They generally have an aspect ratio (ratio of mean diameter to mean particle thickness) of from 2:1 to 25,000:1, preferably from 3:1 to 1000:1 and in particular from 6:1 to 250:1.

The said dimensions for the flake-form supports in principle also apply to the coated effect pigments used in accordance with the invention, since the additional coatings are generally in the region of only a few hundred nanometers and thus do not significantly influence the thickness or length or width (particle size) of the pigments.

A coating applied to the support preferably consists of metal oxides, metal mixed oxides, metal suboxides or metal fluorides and in particular of a colorless or colored metal oxide selected from $TiO_2$, titanium suboxides, titanium oxynitrides, $Fe_2O_3$, $Fe_3O_4$, $SnO_2$, $Sb_2O_3$, $SiO_2$, $Al_2O_3$, $ZrO_2$, $B_2O_3$, $Cr_2O_3$, ZnO, CuO, NiO or mixtures thereof.

The metal fluoride employed is preferably $MgF_2$.

Particular preference is given to effect pigments which have a flake-form support comprising natural or synthetic mica, glass, calcium aluminum borosilicate, $SiO_2$, $Al_2O_3$, and at least one coating on the support, selected from $TiO_2$, titanium suboxides, titanium oxynitrides, $Fe_2O_3$, $Fe_3O_4$, $SnO_2$, $Sb_2O_3$, $SiO_2$, $Al_2O_3$, $MgF_2$, $ZrO_2$, $B_2O_3$, $Cr_2O_3$, ZnO, CuO, NiO or mixtures thereof. In particular, flake-form effect pigments having a support comprising natural or synthetic mica, $SiO_2$ or $Al_2O_3$ are suitable. Substrates comprising $Al_2O_3$ can preferably be used.

The effect pigments can have a multilayered structure in which a plurality of layers, which preferably consist of the above-mentioned materials and have different refractive indices in such a way that in each case at least two layers of different refractive index are located alternately on the support, where the refractive indices in the individual layers differ by at least 0.1 and preferably by at least 0.3 from one another, are located one above the other on a non-metallic support. The layers located on the support here may be either colorless or colored, predominantly transparent, semi-transparent or even opaque.

Depending on the support material used and the type of layers applied, the effect pigments obtained are thus also colorless or have a mass tone, or are predominantly transparent, semi-transparent or opaque. Due to the single- or multilayered system on the support, however, they are additionally capable of producing more or less intense and glossy interference colors.

The so-called LCPs (liquid crystal pigments), which consist of crosslinked, oriented, cholesteric liquid crystals, but also polymer or metal flakes known as holographic pigments, may likewise be employed as effect pigments.

The effect pigments described above may be present individually or as a mixture of two or more in the coatings employed in accordance with the invention. They may likewise be employed in a mixture with organic and/or inorganic dyes or colored pigments and/or also in mixtures with uncoated mica.

The proportion by weight of the effect pigments, preferably of the flake-form effect pigments, in the respective binder-containing coating here is generally between 1 and 35 per cent by weight and preferably between 3 and 30 per cent by weight, based on the particle mass concentration of the dry layer system.

Effect pigments which can be employed are, for example, the commercially available functional pigments, interference pigments or pearlescent pigments offered by Merck KGaA under the names Iriodin®, Colorstream®, Xirallic®, Miraval®, Ronastar®, Biflair®, Minatec®, Lustrepak®, Colorcrypt®, Colorcode® and Securalic®, Mearlin® from Mearl and optically variable effect pigments, Helicone® from Wacker, holographic pigments from Spectratec and other commercially available effect pigments. Particular preference is given to Xirallic® pigments.

As further essential constituent, the coating (A) according to the invention comprises at least one IR-absorbent component. IR-absorbent pigments, in particular dark IR-absorbent pigments, can preferably be employed. Nanoparticulate carbon blacks or phthalocyanines have proven particularly suitable and are already employed anyway as colored pigments in many color recipes. Use is made, for example, of the carbon black grades from Rhône Capital LLC and the Hostaperm® blue grades from Clariant, and the Heliogen® blue grades from BASF, inter alia.

The proportion by weight of the IR-absorbent component here is generally between 0.1 and 10 per cent by weight and preferably between 0.2 and 5 per cent by weight and in particular between 0.5 and 3 per cent by weight, based on the particle mass concentration of the dry layer system.

Besides the effect pigments and the IR radiation-absorbent component, the coating composition for the coating (A) also comprises at least one binder and optionally at least one solvent and optionally one or more assistants.

Suitable binders for coating compositions are in general conventional binders, in particular those based on nitrocellulose, polyamide, acrylic, polyvinylbutyral, PVC, PUR or suitable mixtures thereof, and in particular binders on a UV-curable basis (free-radical or cationic curing). It is obvious that, for the process according to the invention, binders which are transparent after solidification of the corresponding layer are preferably selected for the coating compositions, so that the optionally three-dimensional patterns formed are readily evident optically in the lasered coating (A).

Should an effect pigment-free protective layer (B) have been applied to a layer of this type, this preferably comprises a binder which is likewise transparent after solidification. This protective layer is not modified by the lasered coating (A) underneath it. The corresponding binders are familiar to the person skilled in the art and can preferably be selected from the above-mentioned binders.

Furthermore, the coating composition for the coating (A) and optionally for the protective layer (B) optionally also comprises at least one solvent which consists of water and/or organic solvents or of organic solvent mixtures.

Organic solvents which can be used are all solvents usually used in the said coating methods, for example branched or unbranched alcohols, aromatic compounds or alkyl esters, such as ethanol, 1-methoxypropanol, 1-ethoxy-2-propanol, ethyl acetate, butyl acetate, toluene, etc., or mixtures thereof.

Likewise, generally customary additives, such as fillers, further colored pigments or dyes, UV stabilizers, inhibitors, flameproofing agents, lubricants, dispersants, redispersants, antifoams, flow-control agents, film formers, adhesion promoters, drying accelerators, drying retardants, photo-initiators, etc., can be added to the coating composition(s).

It goes without saying that the specific material composition of the respective coating composition and the viscosity thereof are dependent on the type of coating method selected and the respective coating substrate. The solids content of the coating composition is adjusted here, depending on the method used, coating temperature, coating speed and type of binders, additives and type of substrate, in such a way that the viscosity of the coating composition is sufficient in order to achieve the best-possible transfer of the coating composition from the respective coating apparatus to the substrate or to the first layer. This adjustment of the viscosity is carried out directly on the coating machine and can be carried out without inventive step based on the coating composition manufacturer's instructions or the expert knowledge of the printer or coating expert.

The present process can be used for the production of markings on all surfaces, preferably on painted or printed surfaces. It can be employed both for decorative purposes and also for the production of security features. The markings produced using the process are suitable both for indoor and outdoor areas. Labelling, coding, logos, type designation and other individual markings, for example, can be produced. The process is also particularly suitable for the marking of paints, in particular of automotive paints and industrial paints.

Suitable substrates for the production of the coating according to the invention are a multiplicity of substrates, as are usually employed for the production of a very wide variety of decorative products and security products.

The term decorative product in the sense of the present invention encompasses a broad range of packaging materials, stationery products, specialty papers, textile materials, decorative materials, advertising materials, teaching materials, joke articles, gift articles, furniture coating films or papers, but also materials for the functional coating and/or artistic decoration and labelling of buildings or building parts, highways, signs, vehicles and aircraft, art objects and the like. Particularly preferred products according to the invention are also, inter alia, automobiles or automobile parts.

Security products in the sense of the present invention are regarded as being, for example, labels, admission tickets, travel tickets, passports, identity documents, banknotes, checks, credit cards, shares, stamps, chip cards, driving licenses, certificates, test certificates, revenue stamps, tax seals, vehicle license plates, toll fee stickers, vehicle roadworthiness stickers, particulates stickers or seals, to mention only typical products.

Accordingly, the substrates used in accordance with the invention consist of materials such as paper, cardboard, laminates, wood, metals, in particular metal sheets and foils, polymers, in particular polymeric films, security printing products or materials which comprise constituents of a plurality of these substances. As usual in the case of papers, polymer films and metal substrates, the substrate may optionally also have been electrostatically pretreated and/or provided with a primer layer and/or another anchoring layer.

Particular preference is of course given to substrate materials that are usually also coated by means of painting or printing processes in large runs and via continuous processes, i.e. all types of papers and cardboards as well as polymer films or metal foils, metal sheets and composite materials comprising two or more thereof.

Application methods that are available for the coating (A) and also for the protective layer (B) are in principle all methods which are usually used on the substrates already mentioned above, such as, for example, painting by spraying, dipping, brushing, rolling, electrostatic atomization (powder coating) and coil coating, printing processes, such as gravure, flexographic, screen or offset printing, and paper coating methods of the flake-form effect pigments.

The application of the coating composition to the substrate can be carried out, depending on the desired result, over the entire area or part of the area.

The present invention also relates to a coating on a substrate comprising an optically visible pattern, where the coating comprises at least one effect pigment and at least one IR radiation-absorbent component and where the IR radiation-absorbent component is not present in part-areas of the optical pattern.

Preference is given to a coating in which the IR radiation-absorbent component has been partly or completely displaced, oxidized and/or bleached in part-areas of the optical pattern.

The optically visible pattern is preferably affected by different pearlescence, sparkling (glitter) and/or shimmer in the irradiated and non-irradiated areas of the coating (A).

Particular preference is given to a coating whose optical pattern is not tactile.

The present invention also relates to the use of the coating according to the invention as decorative element, as functional element or as security feature on a product.

The present invention also relates to a product which has a surface which has a preferably three-dimensional pattern in a coating (A) on a substrate comprising paper, cardboard, a laminate, wood, a polymer, a metal, a polymeric film, a metal foil, a security printing product or a material which comprises constituents of a plurality of these substances, and where the substrate has optionally been electrostatically pretreated and/or provided with a primer layer and/or another anchoring layer, and where the coating (A) optionally additionally has a protective layer (B), where the coating (A) comprises at least one effect pigment, preferably flake-form effect pigment, and at least one IR radiation-absorbent component.

Such products are obtainable by the process according to the invention described above and have the preferably three-dimensional patterns described in greater detail above.

The present invention also relates to the use of the products produced by the process according to the invention as or for decorative materials or security products. Details in this respect have likewise already been described above.

It is a particular advantage of the present invention that, with the process according to the invention, a process is available for the production of three-dimensional patterns in coatings which can be employed without major additional equipment and technical complexity for the production of three-dimensional patterns in coatings which comprise flake-form effect pigments.

The computer-supported laser process enables any desired patterns to be produced in a freely selectable sequence and frequency or even individualized labelling per individual product without long set-up times. Rapid and reproducible production of decorative mass articles or security documents is therefore possible in a simple and inexpensive manner by means of the process according to the invention.

In the foregoing and in the examples, all temperatures are set forth uncorrected in degrees Celsius and, all parts and percentages are by weight, unless otherwise indicated.

The entire disclosures of all applications, patents and publications, cited herein and of corresponding European Application No. EP 14001813.6, filed May 23, 2014 are incorporated by reference herein.

All compounds used are known or commercially available. The following examples explain the present invention in greater detail without restricting the scope of protection.

EXAMPLES

Example 1

For the production of a layer system which is applied by a spray application, a conventional refinish paint system having the following recipe is used.

1. Effect Pigment-Containing Paint
2.64% by weight of Xirallic® Crystal Silver (effect pigment, Merck KGaA)
34.90% by weight of XB 383 standard thinner (DuPont)
16.23% by weight of Centari 6000 XB 165 base coat (DuPont)
46.23% by weight of Mix 571 deep black base coat (Standox) (comprising carbon black)
2. Clear Coat (Optional)
90% by weight of 1-component Hightec clear coat (PPG)
10% by weight of Solvesso 100 thinner (Exxon Mobil Chemicals)

The effect pigment is initially introduced and slurried with the thinner. The pigment pastes and optionally binders are subsequently added, and the mixture is homogenized using an impeller stirrer. The ready-to-spray viscosity is established by the addition of thinner, and the paint is applied to a metal sheet using an Oerter automatic sprayer.

After the paint coat has dried, the desired pattern is then lasered using the laser parameters described below. Finally, a clear coat is optionally also applied as protective layer, and the layer system is crosslinked in the oven at 130° C. for 30 min.

Readily visible and high-contrast patterns are obtained.

Example 2

For the production of a layer system which is applied by a spray application, it is also possible to use a plurality of effect pigments or stylings of effect pigment with other colored pigments in the paint.

While only one effect pigment and carbon black as IR-absorbent pigment are employed in Example 1, the following pigment recipes comprising a plurality of effect pigments and phthalocyanines are tested by way of example.
Pigment Recipe 1
10.9% by weight of Colorstream® F20-00 WNT Autumn Mystery (effect pigment, Merck KGaA)
5.1% by weight of Xirallic® SW Crystal Silver (effect pigment, Merck KGaA)
1.3% by weight of Kronos 2310 $TiO_2$ (Kronos)
0.7% by weight of FW 200 carbon black (Rhone)
Pigment Recipe 2
10.8% by weight of Xirallic SW Sunbeam Gold (effect pigment, Merck KGaA)
7.8% by weight of Monastral Green 6Y spec. (Heubach)
3.6% by weight of Heliogen Blue 7080 (BASF)
1.2% by weight of Bayferrox 3920 FF (Lanxess)
0.9% by weight of FW 200 carbon black (Rhône)

The incorporation of the pigments into the paint and the spray coating and lasering are carried out analogously to Example 1. Readily visible and high-contrast patterns are obtained.

Example 3

For the production of a layer system which is applied by powder coating, a so-called dry-blend mixture of the following composition is prepared.
5% by weight of Iriodin® 9119 (effect pigment, Merck KGaA)
95% by weight of Alesta IP Black (DuPont) (comprising carbon black)

To this end, the carbon black-containing powder coating and the effect pigment are weighed out into a plastic container and subsequently mixed homogeneously in an overhead mixer.

After the powder coating operation, the powder coating is baked at 200° C. for 20 min. The desired pattern is subsequently lasered using the laser parameters described below. Readily visible and high-contrast patterns are obtained.

Example 4

For the production of a layer system which is applied by a printing process, the following recipe is used for a screen printing ink.
10% by weight of Xirallic Crystal Silver (effect pigment, Merck KGaA)
5% by weight of Follmann FS 10-801 black (Follmann) (comprising carbon black)
85% by weight of Follmann FS 10-931 aqueous (Follmann)

The effect pigment is stirred into the screen printing binder and converted into a homogeneous screen printing ink using the black tinting paste. The screen printing is carried out using a 61 T screen on various substrates, such as coated papers/photopapers, and also on uncoated papers. After lasering of the desired pattern using the laser parameters described below, an overprint with a UV lacquer can optionally be carried out, for example using the UV binder Weilburger 363030. Readily visible and high-contrast patterns are obtained.

The following laser parameters are used for an IR solid-state laser ($YVO_4$ laser, model Vmc 5) from Trumpf having the wavelength 1064 nm and the average laser power of 12 W in pulsed mode.

Laser parameters for writing on spray-coated metal sheets (FIGS. 1-3)
Trace width: 0.05 mm
Power: 35%
Speed: 300 mm/s
Pulse frequency: 80 kHz Laser parameters of image on spray-coated metal sheets (FIG. 4)
Resolution: 800 dpi
Trace width: 0.05 mm
Power: 33%
Speed: 5000 mm/s
Pulse frequency: 100 kHz Laser parameters for writing on screen prints (substrate: photopaper)
Trace width: 0.05 mm
Power: 40%
Speed: 2500 mm/s
Pulse frequency: 80 kHz If the lasered patterns from FIGS. 1-3 are assessed coloristically, they generally exhibit higher L values than the unlasered areas, since the dark IR absorption pigment is bleached/oxidized or displaced by the laser action.

On use of an effect pigment having a sparkling effect, such as the Xirallic® grades, the sparkling intensity $S_i$ and sparkling area $S_a$ are in addition likewise increased. In particular, a positive difference which increases to a greater extent the flatter the observation angle becomes is evident. This means that, in the lasered area, the effect pigments which are not plane-parallel to the layer surface, but are uncovered by the laser action, also come to reflection.

Table 1 summarizes the differential values $\Delta L$, $\Delta S_i$ and $\Delta S_a$ for lasered coating areas compared with unlasered areas comprising the effect pigments Xirallic® Crystal Silver and Xirallic® Micro Silver for various observation angles.

The angle of incidence is 45°. The observation angle data relate to the difference from the specular angle (FIG. 7).

TABLE 1

Differential measurement values of the L values, sparkling intensity $S_i$ and sparkling area $S_a$, determined using a BykMac measuring instrument.

| | observation angle | | | | | | | | |
|---|---|---|---|---|---|---|---|---|---|
| | ΔL | | | ΔS$_i$ | | | ΔS$_a$ | | |
| Pigment | 15° | 45° | 110° | 15° | 45° | 75° | 15° | 45° | 75° |
| Xirallic ® Crystal Silver | 8.15 | 11.82 | 10.22 | 6.22 | 36.50 | 43.57 | −0.04 | 4.29 | 13.52 |
| Xirallic ® Micro Silver | 6.03 | 8.32 | 5.41 | 1.92 | 12.82 | 20.21 | −0.79 | 2.57 | 14.25 |

($\Delta L = L_{lasered} - L_{unlasered}$, $\Delta S_i = S_{i\ lasered} - S_{i\ unlasered}$, $\Delta S_a = S_{a\ lasered} - S_{a\ unlasered}$)

Figure 1:
FIG. 1 shows a lasered logo in a coating which comprises the effect pigment Xirallic® Crystal Silver (exposure angle: 75°, observation angle: 0°).
Figure 2:
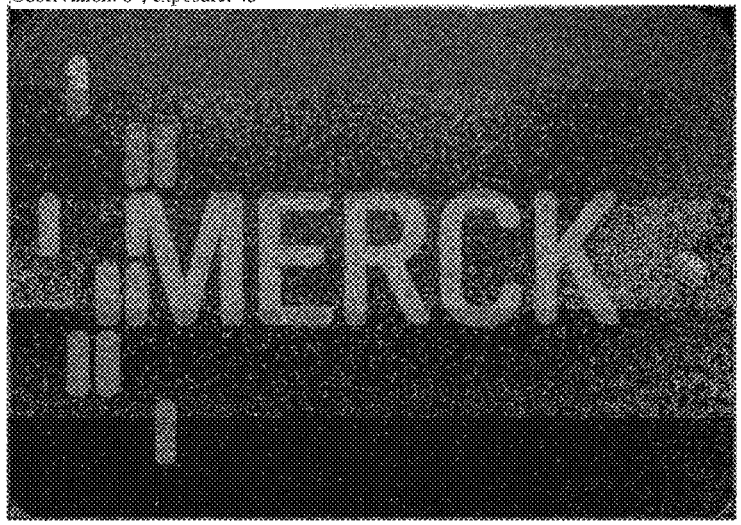
FIG. 2 shows a lasered logo in a coating which comprises the effect pigment Xirallic® Crystal Silver (exposure angle: 45°, observation angle: 0°).
Figure 3:
FIG. 3 shows a lasered logo in a coating which comprises the effect pigment Xirallic® Crystal Silver (photograph in sunlight).
Figure 4:
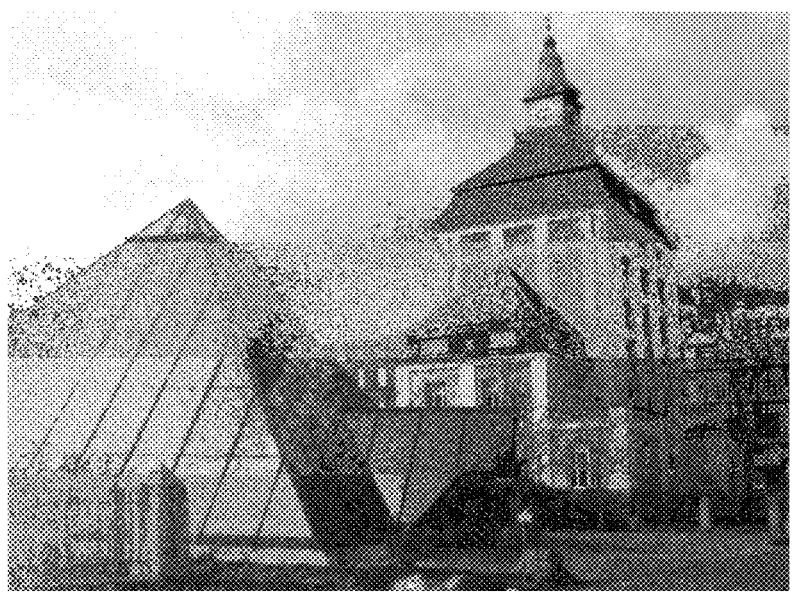
FIG. 4 shows a lasered image in a coating which comprises the effect pigment Xirallic® Crystal Silver.
Figure 5:
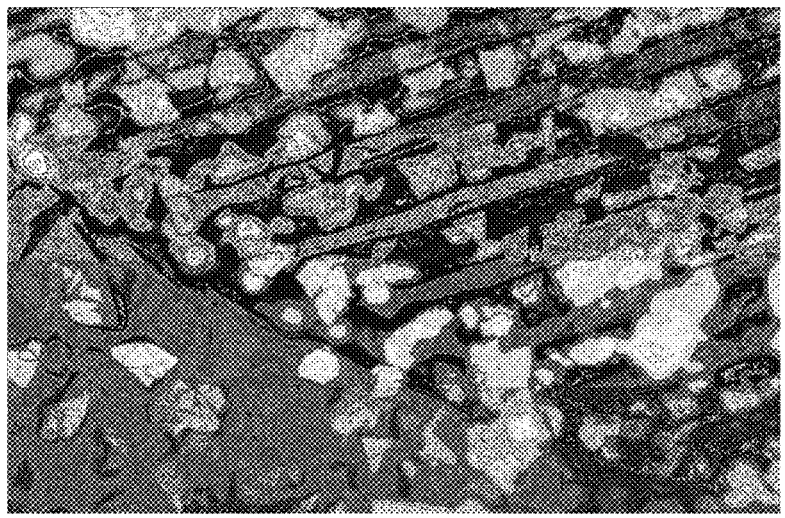
FIG. 5 shows a photomicrograph of the transition from the lasered area (top right) to the unlasered area (bottom left) with full bleaching of the carbon black.
Figure 6:
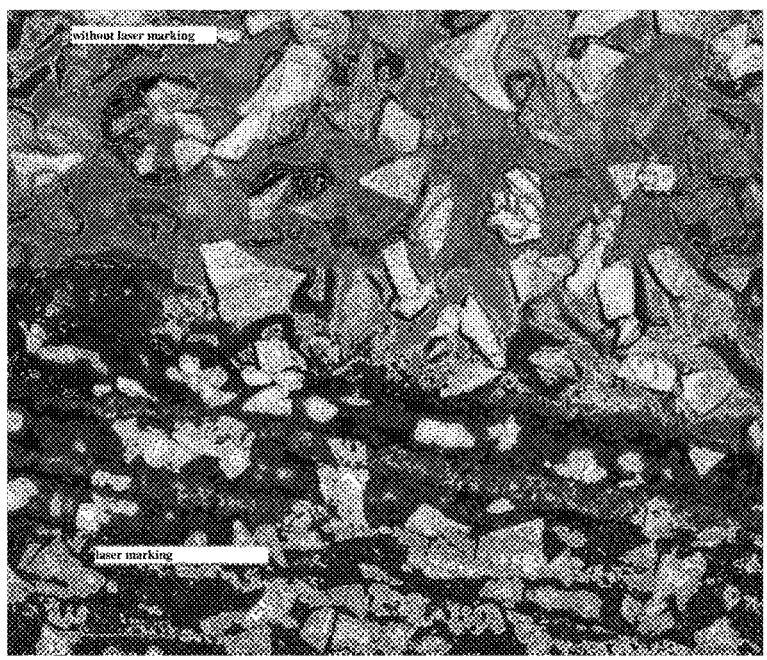
FIG. 6 shows a photomicrograph of the transition from the lasered area (bottom half of the picture) to the unlasered area (top half of the picture) with displacement of the carbon black from the lasered stripes into the edge regions.
Figure 7:
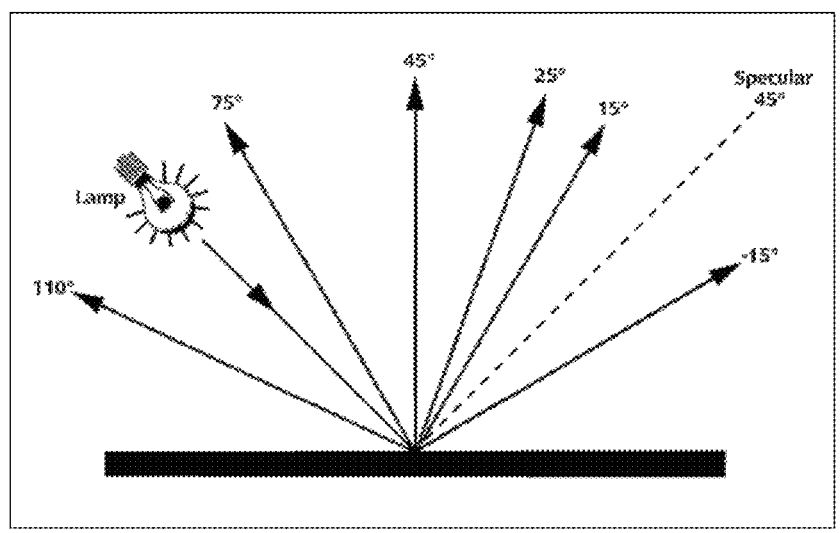
FIG. 7 shows the measurement geometry on the BykMac instrument for determining the ΔL, ΔS$_i$, ΔS$_a$ values.

Without further elaboration, it is believed that one skilled in the art can, using the preceding description, utilize the present invention to its fullest extent. The preceding preferred specific embodiments are, therefore, to be construed as merely illustrative, and not limitative of the remainder of the disclosure in any way whatsoever.

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

The invention claimed is:

1. A process for modifying the optical properties of an effect pigment-containing coating, said process comprising:
   irradiating a coating (A) comprising at least one binder, at least one effect pigment, and one or more IR radiation-absorbent components using an IR laser, whereby solely said one or more IR radiation-absorbent components are partly or completely displaced from irradiated areas of said coating (A) and/or partly or completely oxidized and/or partly or completely bleached in said irradiated areas of said coating (A), and where, in the irradiated areas, said at least one effect pigment which was previously covered by said one or more IR radiation-absorbent components are partly or completely uncovered due to the partial or complete removal, oxidizing, and/or bleaching of said one or more IR radiation-absorbent components by the laser irradiation.

2. The process according to claim 1, wherein said one or more IR radiation-absorbent components are partly or completely displaced from the irradiated areas of the coating (A).

3. The process according to claim 1, wherein said at least one effect pigment is at least one pearlescent pigment, interference pigment, metal-effect pigment and/or liquid-crystal pigment.

4. The process according to claim 3, wherein said at least one effect pigment comprises a support and at least one coating wherein said support is a flake-form support comprising natural mica, synthetic mica, glass, calcium aluminum borosilicate, $SiO_2$, or $Al_2O_3$, and said at least one coating comprises $TiO_2$, a titanium suboxide, a titanium oxynitride, $Fe_2O_3$, $Fe_3O_4$, $SnO_2$, $Sb_2O_3$, $SiO_2$, $Al_2O_3$, $MgF_2$, $ZrO_2$, $B_2O_3$, $Cr_2O_3$, $ZnO$, $CuO$, $NiO$ or mixtures thereof.

5. The process according to claim 3, wherein said one or more IR radiation-absorbent components are selected from carbon blacks, phthalocyanines and mixtures thereof.

6. The process according to claim 1, wherein said irradiating is carried out imagewise.

7. The process according to claim 6, wherein three-dimensional patterns are produced by said laser irradiation.

8. The process according to claim 1, wherein said at least one IR radiation-absorbent component are selected from carbon blacks, phthalocyanines, and mixtures thereof.

9. The process according to claim 1, wherein said IR laser has a wavelength of 0.65-10.6 μm, and is operated in pulsed mode with a pulse frequency of 40-100 kHz.

10. The process according to claim 1, wherein said coating comprises a binder, said at least one effect pigment in an amount between 1 and 35 per cent by weight, based on the particle mass concentration of the dry coating, and said one or more IR radiation-absorbent components in an amount between 0.1 and 10 per cent by weight, based on the particle mass concentration of the dry coating.

11. The process according to claim 10, wherein said coating comprises said at least one effect pigment in an amount between 3 and 30 per cent by weight, based on the particle mass concentration of the dry coating, and said at least one IR radiation-absorbent component in an amount between 0.2 and 5 per cent by weight, based on the particle mass concentration of the dry coating.

12. The process according to claim 10, wherein
   said at least one effect pigment comprises a support and at least one coating wherein said support is a flake-form support comprising natural mica, synthetic mica, glass, calcium aluminum borosilicate, $SiO_2$, or $Al_2O_3$, and said at least one coating comprises $TiO_2$, a titanium suboxide, a titanium oxynitride, $Fe_2O_3$, $Fe_3O_4$, $SnO_2$, $Sb_2O_3$, $SiO_2$, $Al_2O_3$, $MgF_2$, $ZrO_2$, $B_2O_3$, $Cr_2O_3$, ZnO, CuO, NiO or mixtures thereof, and wherein said one or more IR radiation-absorbent components are selected from carbon blacks, phthalocyanines and mixtures thereof.

13. The process according to claim 12, wherein said coating comprises said at least one effect pigment in an amount between 3 and 30 per cent by weight, based on the particle mass concentration of the dry coating, and said one or more IR radiation-absorbent components in an amount between 0.2 and 5 per cent by weight, based on the particle mass concentration of the dry coating.

14. The process according to claim 1, wherein said one or more IR radiation-absorbent components are partly or completely bleached in the irradiated areas of the coating (A).

15. The process according to claim 14, wherein said one or more IR radiation-absorbent components are selected from carbon blacks, phthalocyanines and mixtures thereof.

16. The process according to claim 1, wherein said at least one effect pigment has a flake-form support comprising natural mica, synthetic mica, glass, calcium aluminum borosilicate, $SiO_2$, or $Al_2O_3$, and at least one coating on said flake-form support selected from $TiO_2$, titanium suboxides, titanium oxynitrides, $Fe_2O_3$, $Fe_3O_4$, $SnO_2$, $Sb_2O_3$, $SiO_2$, $Al_2O_3$, $MgF_2$, $ZrO_2$, $B_2O_3$, $Cr_2O_3$, ZnO, CuO, NiO and mixtures thereof.

17. The process according to claim 16, wherein said flake-form support comprises natural mica, synthetic mica, $SiO_2$ or $Al_2O_3$.

18. The process according to claim 16, wherein said flake-form support comprises $Al_2O_3$.

19. A process for modifying the optical properties of an effect pigment-containing coating, said process comprising:
  a) applying a coating (A) comprising at least one binder, at least one effect pigment, and one or more IR radiation-absorbent components to a substrate,
  b) optionally solidifying said coating (A), and
  c) irradiating areas of said coating (A) applied to said substrate using an IR laser, whereby solely said one or more IR radiation-absorbent components are partly or completely displaced and/or partly or completely oxidized and/or partly or completely bleached in said irradiated areas of said coating (A), and, in the irradiated areas, said at least one effect pigment which was previously covered by said one or more IR radiation-absorbent components are partly or completely uncovered due to the partial or complete removal, oxidizing, and/or bleaching of said one or more IR radiation-absorbent components by the laser irradiation.

20. The process according to claim 19, further comprising applying a protective layer (B) to said coating (A) after said irradiating, and then solidifying said coating (A) and said protective layer (B) simultaneously.

21. The process according to claim 19, wherein said one or more IR radiation-absorbent components are partly or completely displaced from the irradiated areas of the coating (A).

22. The process according to claim 19, wherein said one or more IR radiation-absorbent components are partly or completely bleached in the irradiated areas of the coating (A).

23. A coated substrate comprising a substrate and a coating having an optically visible pattern, wherein said coating comprises at least one binder, at least one effect pigment, and one or more IR radiation-absorbent components and wherein said optically visible pattern comprises areas of said coating where the one or more IR radiation-absorbent components are present and areas where the one or more IR radiation-absorbent components are not present.

24. The coated substrate according to claim 23, wherein said optically visible pattern is not tactile.

25. The coated substrate according to claim 23, wherein said substrate is a paper, cardboard, wallpaper, laminate, tissue material, wood, a polymer, a metal, a security printing product or a material which comprises constituents of a plurality of these substances, and where the substrate has optionally been electrostatically pretreated and/or provided with a primer layer and/or another anchoring layer.

26. The coated substrate according to claim 25, wherein said substrate is a polymeric film or a metal foil.

27. A coated substrate comprising a substrate and a coating having an optically visible pattern, wherein said coating comprises at least one binder, at least one effect pigment, and one or more IR radiation-absorbent components, wherein said optically visible pattern comprises areas of said coating where the one or more IR radiation-absorbent components are present and areas where the one or more IR radiation-absorbent components are not present, and wherein said optically visible pattern is obtainable by a process according to claim 1.

28. A method of providing a decorative element, functional element or security feature on a product, said method comprising:
  a) applying a coating (A) comprising at least one binder, at least one effect pigment and one or more IR radiation-absorbent components to a surface of said product,
  b) optionally solidifying said coating (A), and
  c) irradiating areas of said coating (A) applied to said product using an IR laser to form said decorative element, functional element or security feature, whereby solely said one or more IR radiation-absorbent components are partly or completely displaced and/or partly or completely oxidized and/or partly or completely bleached in said irradiated areas of said coating (A), and, in the irradiated areas, said at least one effect pigment which was previously covered by said one or more IR radiation-absorbent components are partly or completely uncovered due to the partial or complete removal, oxidizing, and/or bleaching of said one or more IR radiation-absorbent components by the laser irradiation, and
  d) applying a protective layer (B) to said coating (A) treated in b).

29. The process according to claim 28, wherein said one or more IR radiation-absorbent components are partly or completely displaced from the irradiated areas of the coating (A).

30. The process according to claim 28, wherein said one or more IR radiation-absorbent components are partly or completely bleached in the irradiated areas of the coating (A).

31. A product prepared by the method according to claim 28.

32. The product according to claim 31, wherein said coating (A) is applied to a substrate selected from paper, cardboard, a wallpaper, a laminate, a tissue material, wood, a metal, a polymer, a security printing product and a material which comprises constituents of a plurality of these substances, and where the substrate has optionally been electrostatically pretreated and/or provided with a primer layer and/or another anchoring layer.

33. A product according to claim 31, wherein said product is a decorative material or security product.

34. A process for modifying the optical properties of an effect pigment-containing coating, said process comprising:
   a) applying a coating (A) comprising a binder, at least one effect pigment and one or more IR radiation-absorbent components to a substrate,
   b) drying said coating (A),
   c) irradiating said coating (A) applied using an IR laser, whereby solely said one or more IR radiation-absorbent components are partly or completely displaced from irradiated areas of said coating (A) and/or partly or completely oxidized and/or partly or completely bleached in said irradiated areas of said coating (A), and
   d) optionally applying a protective layer (B) to said coating (A) irradiated in c).

35. A coated substrate comprising a substrate and a coating having an optically visible pattern, wherein said coating comprises at least one binder, at least one effect pigment and one or more IR radiation-absorbent components and wherein said optically visible pattern comprises areas of said coating where the one or more IR radiation-absorbent components are oxidized and/or bleached and areas where the one or more IR radiation-absorbent components are not oxidized and/or bleached.

36. A process for modifying the optical properties of an effect pigment-containing coating, said process comprising:
   irradiating a coating (A) comprising at least one binder, at least one effect pigment, and at least one IR radiation-absorbent component using an IR laser, where said at least one IR radiation-absorbent component is partly or completely displaced from irradiated areas of said coating (A) and/or partly or completely oxidized and/or partly or completely bleached in said irradiated areas of said coating (A), and where, in the irradiated areas, said at least one effect pigment which was previously covered by said at least one IR radiation-absorbent component is partly or completely uncovered due to the partial or complete removal, oxidizing, and/or bleaching of said at least one IR radiation-absorbent component by the laser irradiation,
   wherein said at least one binder of the coating is not carbonized by the laser irradiation, and said at least one effect pigment is not modified.

* * * * *